United States Patent
Yamazaki et al.

(10) Patent No.: US 6,265,719 B1
(45) Date of Patent: Jul. 24, 2001

(54) INSPECTION METHOD AND APPARATUS USING ELECTRON BEAM

(75) Inventors: Yuichiro Yamazaki; Takamitsu Nagai; Motosuke Miyoshi, all of Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/182,415

(22) Filed: Oct. 30, 1998

(30) Foreign Application Priority Data

Oct. 31, 1997 (JP) .................................................. 9-300275

(51) Int. Cl.[7] .................................................. H01J 37/145
(52) U.S. Cl. .................................................. 250/310; 250/397
(58) Field of Search .................................................. 250/310, 397, 250/492.2

(56) References Cited

U.S. PATENT DOCUMENTS

| | | |
|---|---|---|
| 5,576,833 | 11/1996 | Miyoshi et al. . |
| 5,675,148 | * 10/1997 | Marui .................................................. 250/310 |
| 5,894,124 | * 4/1999 | Iwabuchi et al. .................................................. 250/310 |
| 6,011,262 | * 1/2000 | Hamashima et al. .................................................. 250/310 |

FOREIGN PATENT DOCUMENTS 4-242060    8/1992    (JP) .

OTHER PUBLICATIONS

K. Tsuno, Ultramicroscopy, vol. 55, pp. 127–140, "Simulation of a Wien Filter as Beam Separator in a Low Energy Electron Microscope", Apr. 11, 1994.

* cited by examiner

Primary Examiner—Bruce C. Anderson
(74) Attorney, Agent, or Firm—Oblon, Spivak, McClelland, Maier & Neustadt, P.C.

(57) ABSTRACT

An inspection apparatus using an electron beam according to this invention has an electron beam irradiation unit (1–10) for irradiating a sample (11) with an electron beam (31), a projection optical unit (16–21) for forming a one- and/or two-dimensional image or images of secondary and reflected electrons (32) projected in accordance with changes in shape, material, and electrical potential of the sample surface, an electron beam detection unit (22–27) for outputting a detection signal on the basis of the one- and/or two-dimensional image or images, an image display unit (30) for displaying the one- and/or two-dimensional image or images of the sample surface upon receiving the detection signal, and an electron beam deflection unit (27, 43–44) for changing the incident angle of the electron beam coming from the electron beam irradiation unit onto the sample, and guiding the received secondary and reflected electrons to the mapping projection optical unit. With this apparatus, problems of the conventional apparatus (i.e., being unable to inspect defects present on the pattern side wall and difficulties in attaining optical axis adjustment due to the electron beam striking the sample surface at an oblique angle can be solved.

15 Claims, 3 Drawing Sheets

INSPECTION METHOD AND APPARATUS USING ELECTRON BEAM

BACKGROUND OF THE INVENTION

The present invention relates to an inspection method and apparatus using an electron beam and, more particularly, to an inspection method and apparatus suitable for inspecting patterns on semiconductor wafers, photomasks and the like.

As semiconductor devices continue to shrink in size, greater sensitivity is required for detecting defects, foreign matter, and the like on semiconductor wafers and photomasks. In general, since a detection sensitivity of ½ that of the wiring width of a pattern or less is required, the sensitivity of optical column defect inspection will reach its limit in the near future. In place of optical apparatus, an inspection apparatus using an electron beam has been developed and proposed in, e.g., Japanese Patent Laid-Open Nos. 5-258703, 7-249393.

Japanese Patent Laid-Open No. 7-249393 discloses a wafer pattern defect detection apparatus. This apparatus comprises an electron optical column 81 which has a rectangular electron emission cathode, and irradiates a surface 85 of a sample 82 with an electron beam, a secondary electron detection system 84 having a line sensor type secondary electron detector 86 for detecting secondary electrons 83 produced from the sample 82 irradiated with the electron beam, and a circuit 87 for processing the detection signal, as shown in FIG. 1. This defect detection apparatus is characterized by an ability to conduct high-speed pattern defect inspections on semiconductor wafers by setting the aspect ratio of a rectangular beam (which irradiates the sample surface), and executing parallel signal processing in a secondary electron detection system 84.

In relation to the resolving performance of a projection optical system for imaging a one- or two-dimensional image of secondary/reflected electrons produced from the sample, the electric field strength generated between the first electrode of the projection optical system and the sample can be increased and uniformity can be improved by placing the sample in the vicinity of the projection optical system. Hence, the projection optical means is placed so that its optical axis extends perpendicular to the sample surface.

However, conventionally, in order to realize such arrangement, the sample surface must be obliquely irradiated with a rectangular electron beam formed by a primary optical system due to the layout of the primary optical system and projection optical system in the vicinity of the sample surface.

Oblique incidence of the electron beam poses the following problems:

(1) When a pattern with a three-dimensional shape on the sample surface is obliquely irradiated with the irradiated beam, a region which is not irradiated with an electron beam is formed on the side opposite to the incident direction. For this reason, a portion opposite to the incident direction of the pattern appears as a shadow produced by secondary and reflected electrons. For this reason, it has been impossible to observe and inspect defects, foreign matter, and the like present on a pattern side wall, between adjacent patterns, and the like.

(2) Upon irradiation with the electron beam, a negative voltage is applied to the sample. Because of this, when the sample surface is obliquely irradiated with the irradiation beam, the incident position of the electron beam onto the sample shifts from the original axis due to the influence of the electric field present between the sample and projection optical system. It is very hard to attain optical axis adjustment among the irradiated beam system, sample, and projection optical system due to the presence of the electric field.

(3) The electric field is present between the sample and projection optical system, as mentioned above. When this electric field changes, the position on the sample surface irradiated with the electron beam moves, resulting optical axis adjustment errors.

(4) When the electron beam is obliquely incident, electrons reflected by the sample have a distribution in the total opposite direction of the electron beam irradiated. For this reason, the transmittance of reflected electrons to the projection optical system whose axis is perpendicular to the sample surface had been reduced.

As described above, in the conventional method, since the sample surface is obliquely irradiated with an electron beam, it is impossible to inspect defects present on the pattern side wall, and is hard to adjust the optical axis, and so forth.

SUMMARY OF THE INVENTION

It is, therefore, an object of the present invention to provide an inspection method and apparatus using an electron beam, which can solve various problems posed due to oblique incidence of the electron beam.

According to the present invention, there is provided an electron beam inspection apparatus comprising an electron beam irradiation unit for irradiating a sample with an electron beam, a projection optical unit for forming, on an electron beam detection unit, a one- or two-dimensional image of secondary and reflected electrons produced in accordance with the sample surface upon irradiating the sample with the electron beams by the electron beam irradiation unit, the electron beam detection unit for outputting a detection signal on the basis of the one- or two-dimensional image of the secondary and reflected electrons formed by the projection optical unit, an image display unit for receiving the detection signal output from the electron beam detection unit, and displaying the one- or two-dimensional image of the sample surface, and an electron beam deflection unit for changing an incident angle of the electron beam received from the electron beam irradiation unit onto the sample, and making the projection optical unit capture the secondary and reflected electrons received from the sample.

In this way, according to the inspection method and apparatus using an electron beam according to the present invention, the incident angle upon irradiating the sample surface with the electron beam is changed by an electron beam deflection unit, and the projection optical unit captures secondary and reflected electrons produced at the sample surface via the electron beam deflection unit. Hence, any defects or foreign material present in the vicinity of the side wall of the pattern on the sample surface can be inspected, the optical axis and the layout among the electron beam irradiation unit, sample, and projection optical unit can be easily adjusted, and the optical performance of the projection optical unit can also be improved.

The electron beam deflection unit may receive the electron beam from the electron beam irradiation unit between an angle of 10° to 40° from the axis running perpendicular to the sample, and may change the angle of the electron beam to make the electron beam be incident on the sample at 90°±5°.

The cross section of the electron beam from the electron beam irradiation unit may be linear, rectangular, or elliptic in shape. Electron beams of such shapes can improve inspection precision since they can obtain a high current density.

The difference between the incident angle of the electron beam irradiated by the electron beam irradiation unit and deflected by the electron beam deflection unit, and the capturing angle of the secondary and reflected electrons produced from the sample by the mapping projection optical unit via the electron beam deflection unit preferably falls within the range of −5° to +5°.

The electron beam deflection unit may comprise a means for deflecting the electron beam by forming a field in which an electric field and a magnetic field intersect each other on a plane perpendicular to an optical axis of the projection optical unit.

The electron beam irradiation unit may have an electron optical lens system including one or two or more multi-pole lenses.

The electron optical lens system of the electron beam irradiation unit may include quadrupole lenses.

Alternatively, the electron beam irradiation unit may be placed at a position obliquely above the sample surface.

An inspection method using an electron beam according to the present invention comprises the steps of inspecting a sample by irradiating a sample with an electron beam from an electron beam irradiation unit, and displaying a one- or two-dimensional image of secondary and reflected electrons produced in accordance with the surface of the sample via a projection optical unit and an electron beam detection unit, wherein an incident angle of the electron beam from the electron beam irradiation unit onto the sample surface is changed using an electron beam deflection means, and the secondary and reflected electrons are captured by the projection optical unit via the electron beam deflection means.

The electron beam may be deflected by forming a field in which an electric field and a magnetic field intersect each other on a plane perpendicular to the optical axis of the projection optical unit.

The electron beam irradiation unit may be placed at a position obliquely above the sample surface.

As described above, according to the present invention, the electron beam generated by the electron beam irradiation unit is deflected by the electron beam deflection unit, and is perpendicularly incident on the sample surface. Furthermore, secondary and reflected electrons produced from the sample surface are deflected using the electron beam deflection unit, and is then guided to the projection optical unit. When the irradiated electron beam is perpendicularly incident on the sample surface, defects present on the pattern side wall or between adjacent patterns, which cannot be inspected when the sample surface is obliquely irradiated with an electron beam, can be inspected.

Furthermore, when an electric field is present between the sample and mapping projection optical unit, the electron beam is deflected, or distortion or aberration is produced. However, by deflecting the electron beam, such distortion or aberration can be suppressed, and the layout among the electron beam irradiation unit, sample inspection position, and projection optical unit, and the optical axis can be easily adjusted. Upon applying a voltage onto the sample, if this voltage is changed, the optical axis can be prevented from shifting. Furthermore, when the sample surface is irradiated with the electron beam that has been deflected by the electron beam deflection unit in a direction perpendicular to the sample surface, the distribution of secondary and reflected electrons from the sample surface can be perpendicular to the sample surface, thus greatly improving the transmittance of reflected electrons.

DESCRIPTION OF THE PREFERRED EMBODIMENTS

The preferred embodiment of the present invention will be described hereinafter with reference to the accompanying drawings.

Figure 1:
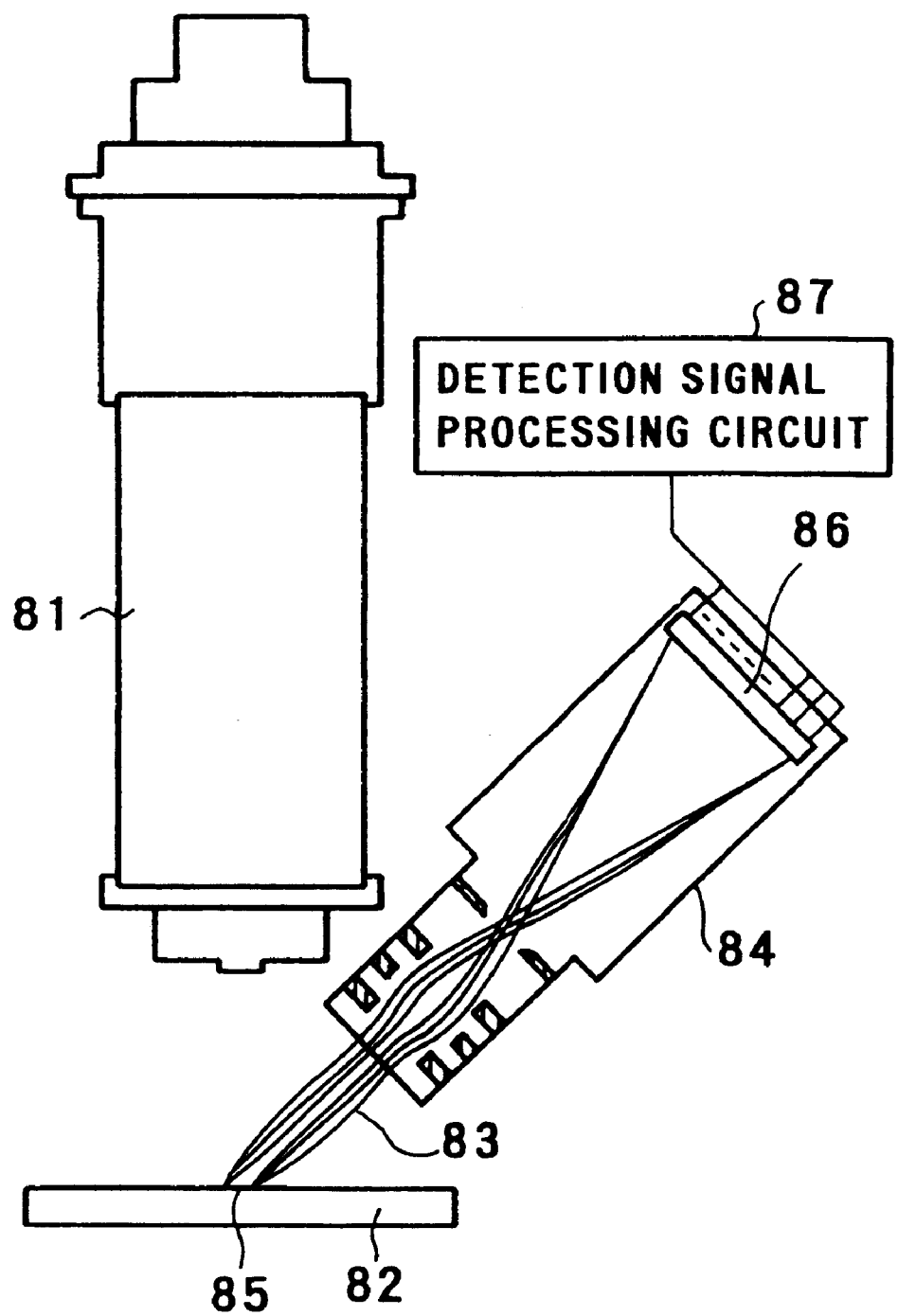
FIG. 1 is a schematic view showing the arrangement of a conventional electron beam inspection apparatus.
Figure 2:
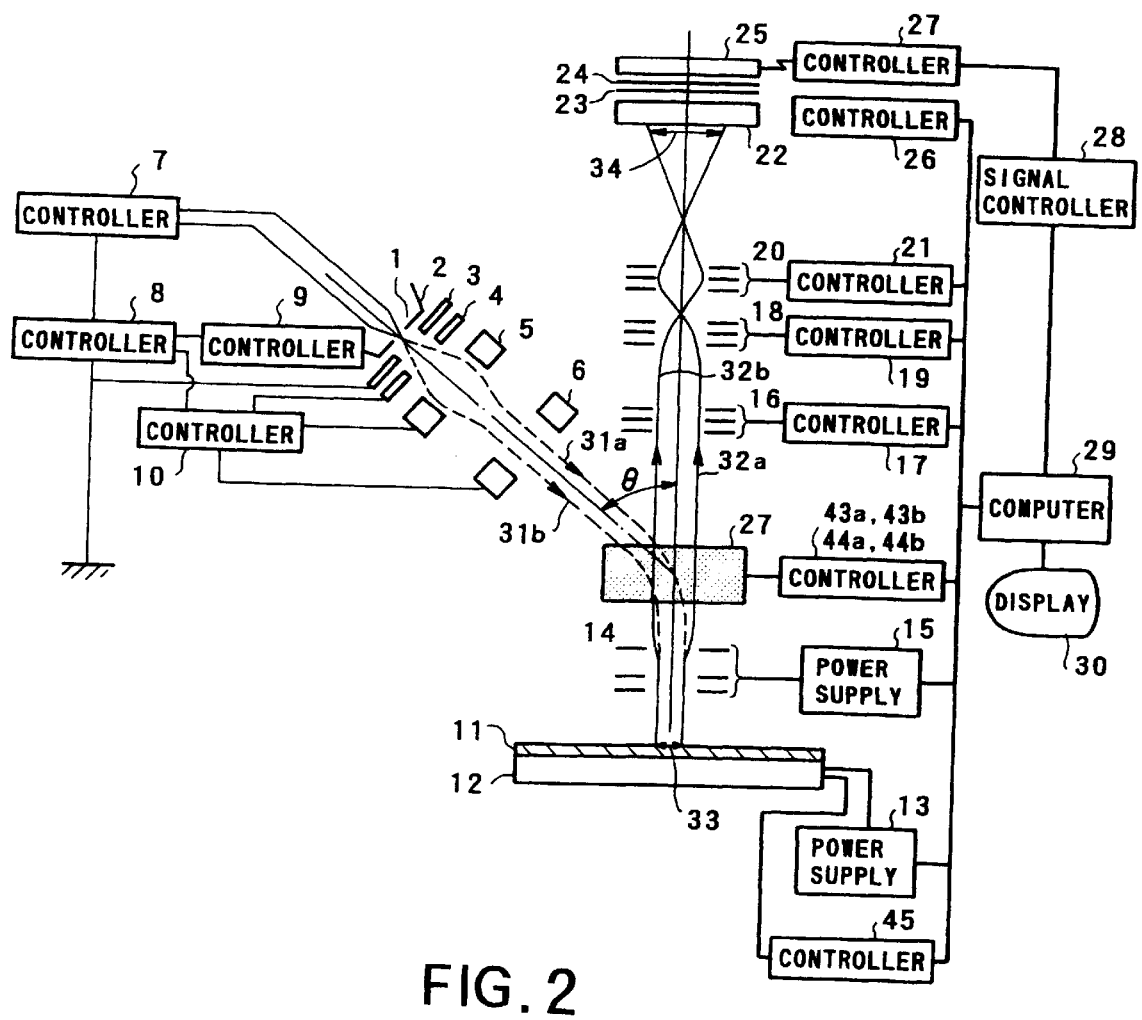
FIG. 2 is a block diagram showing the arrangement of an electron beam inspection apparatus according to the first embodiment of the present invention.

FIG. 2 shows the arrangement of an electron beam inspection apparatus according to an embodiment of the present invention. The inspection apparatus mainly comprises an electron beam irradiation unit and its controller, a sample stage 12 and its controller, a secondary/reflected electron beam mapping projection optical unit and its controller, an electron beam detection unit and its controller, and an electron beam deflection unit and its controller as the characteristic feature of this embodiment.

The electron beam irradiation unit is placed obliquely upward to make a given angle θ (e.g., 10 to 40°) from the axis running perpendicular to the surface of the sample 11, such as a semiconductor wafer or photomask, placed on the stage 12. When this angle θ becomes equal to or smaller than 10°, the electron beam irradiation unit and electron beam detection unit become too close to place them without interference between them. By contrast, when the angle θ exceeds 40°, the irradiation angle from the electron beam irradiation unit becomes too large, resulting in inspection precision drop. Hence, the angle θ is determined to fall within the range of 10° to 40°. The angle θ may be reduced if a further size reduction of the apparatus is achieved.

The electron beam irradiation unit comprises an electron gun, and two quadrupole lenses. More specifically, the electron gun comprises a lanthanum hexaboride (to be referred to as LaB6 hereinafter) cathode 1 having a 100 $\mu$m×10 $\mu$m rectangular electron emission surface, a Wehnelt electrode 2 having a rectangular aperture, an anode 3 having a rectangular aperture, and a deflector 4 for adjusting the optical axis. Since the cathode 1 has a rectangular electron emission surface, the electron beam has a rectangular sectional shape. When the shape of the cross-section of the electron beam is elongated, i.e., is linear of elliptical instead of rectangular, the current density can be increased, thus obtaining a high S/N ratio of the detection signal. However, the present invention is not limited to this, and electron beams having various other sectional shapes may be used.

The operations of the LaB6 cathode 1, Wehnelt electrode 2, anode 3, and deflector 4 are controlled by controllers 7, 8, and 10 to adjust the acceleration voltages, emission currents, and optical axis of electron beams 31*a* and 31*b*.

Also, two, electrostatic quadrupole lenses 5, 6, and the controller 10 for controlling the operations of these lenses 5, 6 are provided. The electron beams 31a, 31b emitted by the cathode 1 are converged by the lenses 5, 6 to form rectangular beams having a size around 100 µm×25 µm on the surface of the sample 11. The converted electron beams enter an electron beam deflection unit 27. In this way, the electron beams emitted by the electron beam irradiation unit enter the electron beam detection unit 27 at an oblique angle θ with respect to the surface of the sample 11. The present invention is not limited to the quadrupole lenses, but an electron optical lens system may be constructed by one lens or two or more multi-pole lenses.

When the electron beams 31a and 31b enter the electron beam deflection unit 27, they are deflected in a direction nearly perpendicular to the surface of the sample 11, and then leave the electron beam deflection unit 27. The electron beams that have left the unit 27 are reduced by a rotational-symmetric electrostatic lens 14 applied with a predetermined voltage, and perpendicularly illuminate the surface of the sample 11.

As will be described later, the capturing angle of secondary and reflected electrons produced from the surface of the sample 11 by the projection optical system is 90° with respect to the surface of the sample 11. Hence, both the incident angle of the electron beams onto the sample 11 and the capturing angle of the secondary and reflected electrons produced from the surface of the sample 11 by the projection optical system are 90° with respect to the surface of the sample 11. However, these two angles need not always perfectly agree with each other, and may have a difference falling within the range of −5° to +5°.

The sample 11 is applied with a predetermined voltage by a power supply 13. The movement of the stage 12 on an X-Y plane is controlled by a controller 45. The value of the voltage to be applied to the sample 11 must be determined on the basis of the resolving performance of the mapping projection optical system (to be described later).

For example, in order to obtain a resolution of 0.1 µm or less, since a secondary/reflected electron beam is required to have a voltage around 5 kV, the voltage to be applied to the sample is preferably about 5 kV. However, the energy of the electron beam is determined by the difference between the voltage applied to the sample 11, and that of the electron beam incident on the sample 11. When a semiconductor wafer is inspected as the sample 11, a voltage around 800 V to be applied to the semiconductor wafer is generally used. Hence, the electron beam preferably has a voltage around 5.8 kV.

When the electron beams 31a and 31b illuminate the surface of the sample 11, the surface of the sample 11 emits secondary/reflected electrons 32a and 32b having shape/material/potential information of the wafer surface. As described above, these electrons are accelerated by an acceleration electric field generated between the sample 11 and electrostatic lens 14 by the voltage applied from the power supply 13 to the sample 11, and enter the electron beam deflection unit 27 while forming a path having a focal point at infinity.

In this case, the electron beam deflection unit 27 operates to make the secondary/reflected electron beams 32a and 32b coming from the sample 11 side travel straight under the control of controllers 43a and 43b, and 44a and 44b. As a consequence, the electron beams travel straight through the electron beam deflection unit 27, and then enter the projection optical unit.

The projection optical unit is placed, so that its optical axis extends in a direction perpendicular to the surface of the sample 11, and comprises three rotational-symmetric electrostatic lenses. The electron beams 32a and 32b are enlarged by electrostatic lenses 16, 18, and 20. The voltages to be applied to the electrostatic lenses 16, 18, and 20 are respectively controlled by controllers 17, 19, and 21.

The enlarged electron beams 32a and 32b are detected by the electron beam detection unit. The electron beam detection unit comprises an MCP detector 22, a fluorescent screen 23, a light guide 24, and a CCD camera 25. The electron beams 32a and 32b that enter the MCP detector 22 are amplified to 104 to 106 times, and illuminate the fluorescent screen 23. Upon irradiating the fluorescent screen 23 with the electron beams, a fluorescent image is formed, and is detected by the CCD camera 25 via the light guide 24.

Furthermore, the CCD camera 25 transfers the detected fluorescent image as image data to an image data host computer 29 via a signal controller 28 under the control of a controller 27. The image data host computer 29 displays an image on a display 30, saves and processes image data, and so forth.

Figure 3:
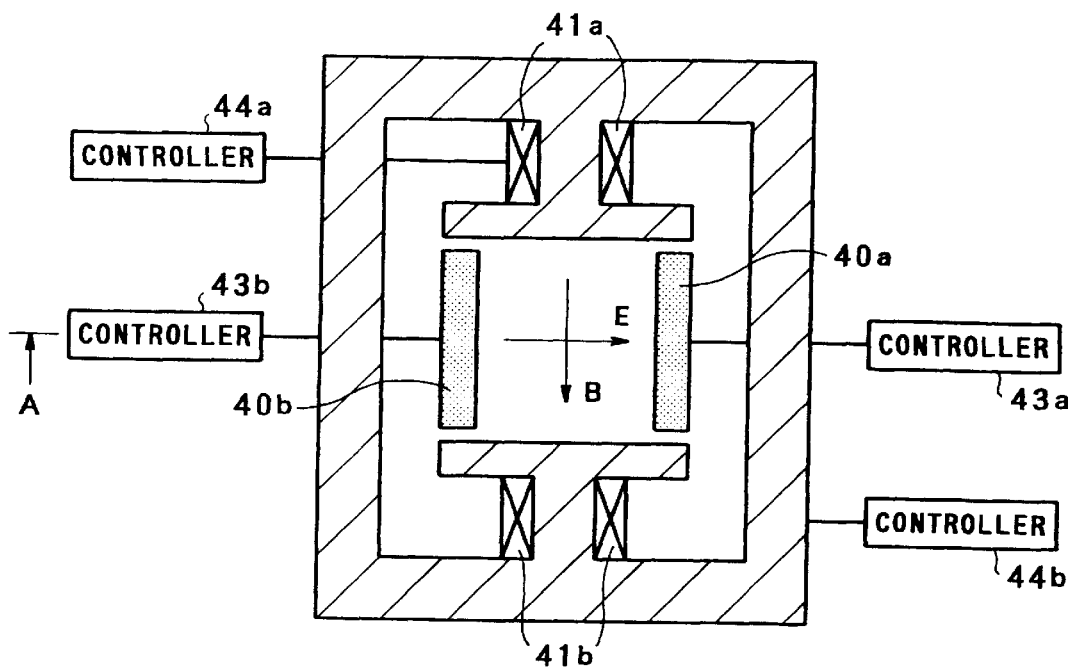
FIG. 3 is a cross-sectional view showing the arrangement of an electron beam deflection unit in the electron beam inspection apparatus of the first embodiment in detail.
Figure 4:
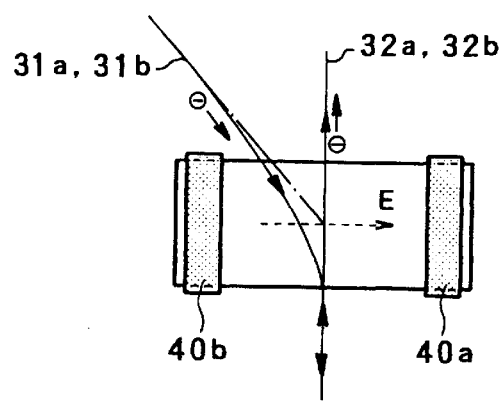
FIG. 4 is a longitudinal sectional view showing the structure taken along the line A—A in FIG. 3.

The detailed structure of the electron beam deflection unit 27 will be explained below with reference to FIG. 3 and FIG. 4 that shows the longitudinal section taken along the line A—A in FIG. 3. As shown in FIG. 3, the field of the electron beam deflection unit has a structure in which an electric field and a magnetic field intersect each other in a plane perpendicular to the optical axis of the projection optical unit, i.e., an E×B structure.

Electric fields are generated by plane-parallel electrodes 40a, 40b. The electric fields generated by the plane-parallel electrodes 40a, 40b are respectively controlled by the controllers 43a, 43b. By placing electromagnetic coils 41a and 41b in a direction perpendicular to the plane-parallel electrodes 40a and 40b for generating electric fields, magnetic fields are generated.

In order to improve the uniformity of the magnetic fields, the coils 41a and 41b have plane-parallel shaped pole pieces to form a magnetic path 42. FIG. 4 shows the behavior of the electron beams in the longitudinal section taken along the line A—A. The electron beams 31a, 31b irradiated are deflected by the electric fields generated by the plane-parallel electrodes 40a, 40b, and the magnetic fields generated by the electromagnetic coils 41a, 41b, and then pass through the electrostatic lens 14, thus perpendicularly irradiating the surface of the sample 11.

The secondary/reflected electron beams 32a and 32b produced on the surface of the sample 11 are accelerated by an acceleration electric field generated between the sample 11 and electrostatic lens 14, and travel in a direction perpendicular to the surface of the sample 11. The electron beams 32a and 32b pass through the electrostatic lens 14, and then enter the electron beam deflection unit 27.

The incident positions and angles of the irradiated electron beams 31a, 31b to the electron beam deflection unit 27 are uniquely determined if the energy of electrons is determined. Furthermore, when the controllers 43a, 43b, and 44a, 44b respectively control the electric fields generated by the plane-parallel electrodes 40a, 40b and the magnetic fields generated by the electromagnetic coils 41a and 41b to satisfy the conditions of the electric and magnetic fields, i.e., vB=eE so as to make the secondary/reflected electron beams 32a and 32b travel straight, the secondary/reflected electron beams travel straight through the electron beam deflection unit 27, and then enter the mapping projection optical unit.

In the equation, vB=vE, v is the velocity (m/s) of each electron beam 32, B is the magnetic field (T), e is the charge amount (C), and E is the electric field (V/m).

As described above, according to this embodiment, the irradiated electron beams 31a and 31b can be incident on the surface of the sample 11 not obliquely but perpendicularly.

Hence, since the above-mentioned problems posed when the electron beams obliquely incident on the surface of the sample 11 can be solved, defects, foreign material, and the like present in the vicinity of the side wall of the pattern, or between neighboring patterns can be observed and inspected. Also, optical axis adjustment of the electron beam irradiation unit, sample, and mapping projection optical unit can be easily made, and their mechanical layout can be easily determined.

Furthermore, a shift of the irradiation position of the rectangular beam, blurring of the beam shape due to distortion and aberration, and the like, which take place upon oblique incidence of the electron beams can be simultaneously avoided. Moreover, the detection efficiency of secondary and reflected electrons can be greatly improved.

To restate, since the mechanical layout of the electron beam irradiation unit, the sample, and the mapping projection optical unit in the vicinity of the sample surface is simplified, the electric field strength and uniformity on the sample surface can be improved, thereby improving the performance of the mapping projection optical unit.

What is claimed is:

1. An electron beam inspection apparatus comprising:
   an electron beam irradiation unit configured to irradiate a sample with an electron beam;
   a mapping projection optical unit configured to form at least one of one-dimensional and two-dimensional images of secondary and reflected electrons produced in accordance with a sample surface of the sample upon irradiating the sample with the electron beam by said electron beam irradiation unit;
   an electron beam detection unit configured to output a detection signal based on the at least one of one-dimensional and two-dimensional images of the secondary and reflected electrons formed on said electron beam detection unit by said mapping projection optical unit;
   an image display unit configured to receive the detection signal output from said electron beam detection unit and display the at least one of one-dimensional and two-dimensional images of the sample surface; and
   an electron beam deflection unit configured to deflect the electron beam received from said electron beam irradiation unit onto the sample and allow said mapping projection optical unit to capture the secondary and reflected electrons received from the sample;
   wherein said electron beam deflection unit receives the electron beam from said electron beam irradiation unit at an angle of 10° to 40° from an axis running perpendicular to the sample and changes an angle of the electron beam to make the electron beam be incident on the sample at 90°±5°.

2. An apparatus according to claim 1, wherein the electron beam from said electron beam irradiation unit has a cross-section which is at least one of linear, rectangular and elliptic in shape.

3. An apparatus according to claim 1, wherein a difference between an incident angle of the electron beam irradiated by said electron beam irradiation unit and deflected by said electron beam deflection unit, and the capturing angle of the secondary and reflected electrons produced from the sample by said mapping projection optical unit via said electron beam deflection unit falls within the range of −5° to +5°.

4. An apparatus according to claim 1, wherein said electron beam deflection unit comprises means for deflecting the electron beam by forming a field in which an electric field and a magnetic field intersect each other in a plane perpendicular to an optical axis of said mapping projection optical unit.

5. An apparatus according to claim 1, wherein said electron beam irradiation unit has an electron optical lens system including at least one multi-pole lens.

6. An apparatus according to claim 5, wherein said electron optical lens system of said electron beam irradiation unit includes a plurality of quadrupole lenses as the at least one multi-pole lens.

7. An apparatus according to claim 1, wherein said electron beam irradiation unit is positioned obliquely above the sample surface.

8. An apparatus according to claim 1, wherein said electron beam deflection unit comprises a deflection device configured to deflect the electron beam by forming a field in which an electric field and a magnetic field intersect each other in a plane perpendicular to an optical axis of said mapping projection optical unit.

9. An electron beam inspection apparatus comprising:
   electron beam irradiation means for irradiating a sample with an electron beam;
   mapping projection optical means for forming at least one of one-dimensional and two-dimensional images of secondary and reflected electrons produced in accordance with a sample surface of the sample upon irradiating the sample with the electron beam by said electron beam irradiation means;
   electron beam detection means for outputting a detection signal based on the at least one of one-dimensional and two-dimensional images of the secondary and reflected electrons formed on said electron beam detection means by said mapping projection optical means;
   image display means for receiving the detection signal output from said electron beam detection means and displaying the at least one of one-dimensional and two-dimensional images of the sample surface; and
   electron beam deflection means for deflecting the electron beam irradiated from said electron beam irradiation means toward the sample and allowing said mapping projection optical means to capture the secondary and reflected electrons received from the sample;
   wherein said electron beam deflection means receives the electron beam from said electron beam irradiation means at an angle of 10° to 40° with respect to an axis running perpendicular to the sample and deflects the electron beam to be incident on the sample at 90°±5° with respect to the sample.

10. An apparatus according to claim 9, wherein the electron beam from said electron beam irradiation means has a cross-section which is at least one of linear, rectangular and elliptic in shape.

11. An apparatus according to claim 9, wherein a difference between an incident angle of the electron beam deflected by said electron beam deflection means with respect to the sample and a capturing angle of the secondary and reflected electrons produced from the sample with respect to said mapping projection optical means via said electron beam deflection means falls within the range of −5° to +5°.

12. An apparatus according to claim 9, wherein said electron beam deflection means deflects the electron beam by forming a field in which an electric field and a magnetic field intersect each other in a plane perpendicular to an optical axis of said mapping projection optical means.

13. An apparatus according to claim 9, wherein said electron beam irradiation means includes an electron optical lens system including at least one multi-pole lens.

14. An apparatus according to claim 13, wherein said electron optical lens system of said electron beam irradiation means comprises a plurality of quadruple lenses.

15. An apparatus according to claim 9, wherein said electron beam irradiation means is positioned obliquely above the sample surface.

\* \* \* \* \*